United States Patent [19]
Gorecki

[11] Patent Number: 5,493,205
[45] Date of Patent: Feb. 20, 1996

[54] LOW DISTORTION DIFFERENTIAL TRANSCONDUCTOR OUTPUT CURRENT MIRROR

[75] Inventor: James L. Gorecki, Hillsboro, Oreg.

[73] Assignee: Lattice Semiconductor Corporation, Hillsboro, Oreg.

[21] Appl. No.: 403,354

[22] Filed: Mar. 14, 1995

Related U.S. Application Data

[63] Continuation-in-part of Ser. No. 396,994, Mar. 1, 1995.

[51] Int. Cl.$^6$ ................................ G05F 3/16; H03F 3/04
[52] U.S. Cl. ..................... 323/315; 323/316; 330/257; 330/288
[58] Field of Search ..................... 323/282, 312, 323/315, 316, 317; 330/257, 278, 288; 327/535, 538, 540, 560, 561

[56] References Cited

U.S. PATENT DOCUMENTS

| | | | |
|---|---|---|---|
| 4,546,307 | 10/1985 | Llewellyn | 323/315 |
| 4,752,693 | 6/1988 | Nagano | 250/551 |
| 5,365,161 | 11/1994 | Inoue et al. | 323/282 |
| 5,398,005 | 3/1995 | Lorenz | 330/304 |
| 5,404,097 | 4/1995 | Barou | 323/312 |
| 5,434,499 | 7/1995 | Narikawa et al. | 323/315 |
| 5,442,309 | 8/1995 | Cabler | 327/108 |
| 5,442,318 | 8/1995 | Badyal et al. | 330/258 |

OTHER PUBLICATIONS

Scott D. Willingham, Kenneth W. Martin, and A. Ganesa, "A BiCMOS Los–Distortion 8–MHz Los–Pass Filter", IEEE Journal of Solid–State Circuits, vol. 28, No. 12, Dec. 1993, pp. 1234–1245.

Primary Examiner—Matthew V. Nguyen
Attorney, Agent, or Firm—Skjerven, Morrill, MacPherson, Franklin & Friel

[57] ABSTRACT

A current mirror for use with a transconductor is disclosed. The current mirror includes an input resistor which changes an input current to a voltage, an output resistor having a value which is scaled with respect to the input resistor, an amplifier which senses the input voltage and the voltage across the output resistor and an output transistor having a gate coupled to the output of the amplifier and a source coupled to the output resistor is disclosed. Such a current mirror advantageously provides a transconductor having low distortion.

14 Claims, 4 Drawing Sheets

LOW DISTORTION DIFFERENTIAL TRANSCONDUCTOR OUTPUT CURRENT MIRROR

CROSS REFERENCE TO RELATED APPLICATION

This application is a continuation in part of copending, commonly assigned U.S. patent application Ser. No. 08/396,944 filed on Mar. 1, 1995, entitled Continuous Time Programmable Analog Block Architecture and having the Attorney Docket Number M-3102-US. The above-referenced application is incorporated herein by reference in its entirety.

BACKGROUND OF THE INVENTION

The present invention relates to current mirrors, and more particularly, to output current mirrors for use with transconductor circuits.

It is known to provide current mirrors which include two transistors as shown in FIG. 1. In such a current mirror, transistor N1 is diode connected. The gate of transistor N1 is connected to the gate and drain of transistor N2, thus forcing the same gate to source voltage on both N1 and N2. If transistor N1 is in the "saturated" mode of operation (i.e., $V_{ds}$ of N1 is $>V_{gs}-V_t$ of N1 where $V_{ds}$ is the drain to source voltage, $V_{gs}$ is the gate to source voltage, and $V_t$ is the threshold voltage) the current into the drain node of N1 is ideally proportional to the current into the drain node of N2 by the ratio of the transistor's gate widths and inversely proportional to the transistor's gate lengths. However, when there is a threshold mismatch, i.e., the threshold voltage of N1 is not equal to the threshold voltage of N2, there arises serious distortion in the drain current of N1 with respect to the input current in the drain of N2. Typically, 1 to 2 millivolts of threshold mismatch between transistors N1 and N2 can produce distortion levels of −60 dB or more.

Current mirrors are required in the design of high linearity, low distortion, continuous time transconductors in CMOS. A transconductor is a circuit which receives an input voltage and generates an output current. The magnitude of the output current is proportional to the input voltage received; the ratio by which the output current changes for a given ratio of input voltage change is known as the conversion gain, or transconductance (GM), of the transconductor. A differential transconductor receives a differential voltage impressed between two input terminals (ignoring the common-mode voltage) and generates a differential current on two current output terminals.

A differential transconductor 20 which is known in the art is shown in FIG. 2. The topology of this circuit is generally known as a degenerated pair linearized by servo-feedback. A differential input voltage, $V_L-V_R$, is received on input terminals 22, 24 and a corresponding differential current is generated at current output terminals 26, 28. Transconductor 20 includes current source circuit 30 as well as input circuits 32, 34. Current source circuit 30 includes current sources 36, 37 which provide currents in the amount of $I_o$ to summing nodes 38, 39, respectively. Input circuit 32 includes operational amplifier 40 having a non-inverting input coupled to input voltage terminal 22 and an inverting input coupled to summing node 38. The output of operational amplifier 40 drives the gate of transistor 42, which in this embodiment is shown as a P channel MOS transistor. Transistor 42 couples summing node 38 to current output terminal 26. Input circuit 34 includes operational amplifier 50 having a non-inverting input terminal coupled to input voltage terminal 24 and an inverting input terminal coupled to summing node 39. The output of operational amplifier 50 drives the gate of transistor 52, which is also shown as a P channel MOS transistor. Transistor 52 couples summing node 39 to current output terminal 28. Transconductor 20 also includes resistor 54 having a resistance of R ohms. Resistor 54 couples summing node 38 to summing node 39. Current output terminals 28, 29 are coupled to respective current mirrors 56, 57, which in turn provide differential current outputs $I_L'$ and $I_R'$ to current mirror current output terminals 58, 59. Current mirrors 56, 57 are similarly configured to provide output currents having the same ratio to the currents which are provided to the respective current mirrors.

The operation of this circuit can best be understood by reference to the left portion of the transconductor. Input circuit 32 forces the voltage of summing node 38 to follow the voltage, $V_L$, received on input voltage terminal 22. This occurs because operational amplifier 40 drives the gate of transistor 42 to a suitable voltage such that the voltage of summing node 38, which is coupled to the inverting input of operational amplifier 40, follows the voltage, $V_L$, coupled to the non-inverting input of operational amplifier 40. Similarly, with respect to the right portion of the transconductor, input circuit 34 forces the voltage of summing node 39 to follow voltage, $V_R$, received on input voltage terminal 24. This occurs because operational amplifier 50 drives the gate of transistor 52 to a suitable voltage such that the voltage of summing node 39, which is coupled to the inverting input of operational amplifier 50, follows the voltage $V_R$ coupled to the non-inverting input of operational amplifier 50. Thus, with summing node 38 following input voltage $V_L$ and summing node 39 following input voltage $V_R$, the differential input voltage $V_L-V_R$ is placed across resistor 54, and causes a current, $I_s$, of magnitude $(V_L-V_R)/R$ to flow from summing node 38 to summing node 39. If $V_R$ is greater in magnitude than $V_L$, then a negative current $I_s$ flows from summing node 38 to summing node 39 which, of course, is equivalent to a positive current flow from summing node 39 to summing node 38.

Summing node 38 receives a current $I_o$ from current source 36 and sources a current $I_s$ flowing into summing node 39. Thus, the net current provided to the source of transistor 42 is $I_o-I_s$, which is coupled via transistor 42 to current output terminal 26. Similarly, summing node 39 receives a current $I_o$ from current source 37, and receives a current $I_s$ flowing from summing node 38. Thus, the net current supplied to the source of transistor 52 is $I_o+I_s$, which is coupled via transistor 52 to current output terminal 28. Current output terminals 26, 28 provide respective currents $I_L$ and $I_R$ to current mirrors 56, 57 which provide output currents $I_L'$ and $I_R'$ to current mirror current output terminals 58, 59. Currents $I_L'$ and $I_R'$ are proportional to the currents $I_L$ and $I_R$.

In this transconductor, transistor N2 of the current mirrors 56, 57 has a drain to source voltage equal to the threshold voltage of the transistor plus an excess voltage related to the square root of the current into the drain of transistor N2 and its gate width and gate length. Accordingly, the threshold voltage present at the current output terminals of the transconductor is limited by this configuration In transconductors which use current mirrors implemented using BiCMOS or Bipolar technologies, the inherent $V_{BE}$ matching of bipolar transistors produces a high linearity current mirror which does not add distortion to the transconductor output. However, in transconductors which are implemented using CMOS technologies such as that shown in FIG. 1, a current mirror which is located at the output of the transconductor may provide a source of distortion. One challenge with designing current mirrors is that the normal process variations of the threshold voltages, $V_t$, between two MOS devices which are used in a current mirror may prevent design of a low distortion transconductor.

SUMMARY OF THE INVENTION

It has been discovered that providing a transconductor with a current mirror with an input resistor through which an input current is passed to provide a first voltage, an output resistor, and an amplifier which senses the input voltage and the voltage across the output resistor and an output transistor having a gate coupled to the output of the amplifier and a source coupled to the output resistor advantageously provides a transconductor having low distortion.

Additionally, it has been discovered that a programmable current mirror may be provided by providing an amplifier with a plurality of resistance access paths into an output resistor string of the feedback path of the amplifier thus advantageously reducing distortion attributable to the current mirror. The branches are provided using switches. Because no current flows through the switches due to the high input impedance of the amplifier, the switches do not contribute noise or distortion to the programmable current mirror. Such a system advantageously may be implemented as either a fixed or programmable current divider or multiplier.

Additionally, such a system maximizes the input swing of a transconductor based upon a degenerated pair linearized by servo-feedback, i.e., the range of the input voltage $V_L$ or $V_R$ while the transconductor maintains high linearity, by keeping the voltage at the output terminals as low as possible. The present invention eliminates the threshold voltage present at the output terminals of the transconductor.

Additionally, such a system advantageously eliminates MOS threshold mismatch as a source of distortion. Additionally, such a system advantageously controls distortion of the current mirror by removing transistor threshold mismatches from effecting the distortion. Additionally, such a system advantageously makes MOS threshold mismatch in current mirrors an offset which can be trimmed out of the circuit.

DETAILED DESCRIPTION

The following sets forth a detailed description of the best contemplated mode for carrying out the invention. The description is intended to be illustrative of the invention and should not be taken to be limiting.

Figure 1:
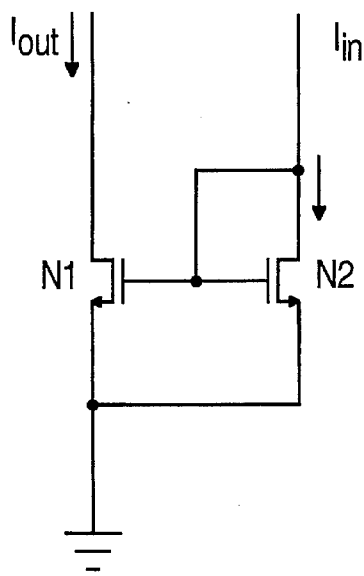
FIG. 1, labeled prior art, shows a schematic block diagram of a prior art current mirror.
Figure 3:
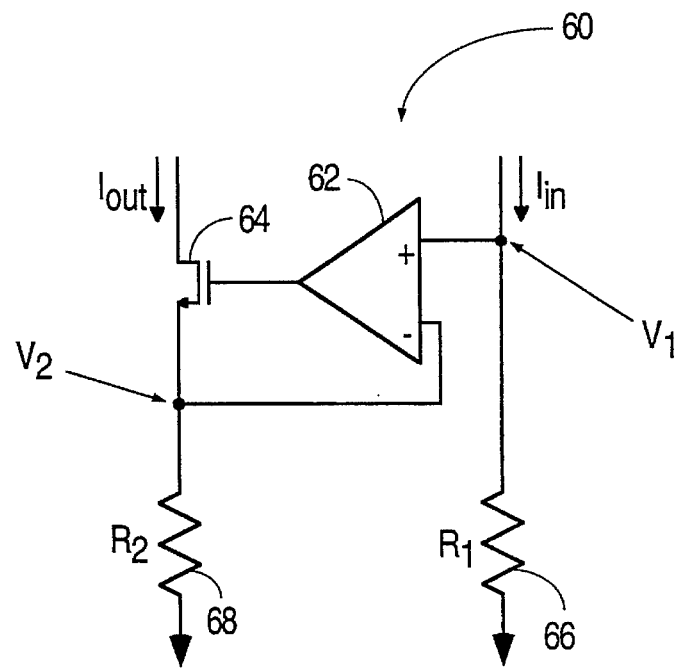
FIG. 3 shows a schematic block diagram of a current mirror in accordance with the present invention.
Figure 2:
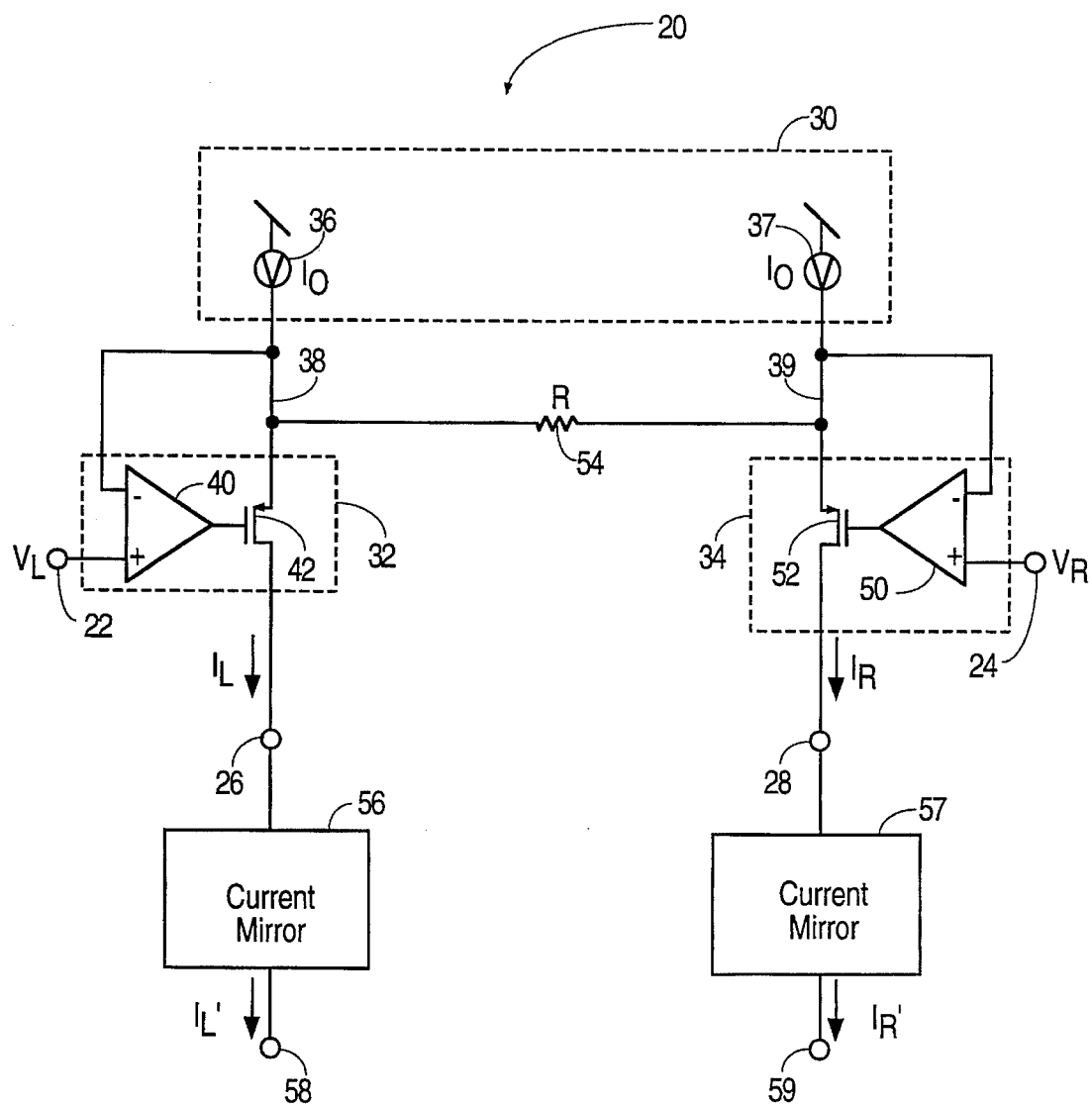
FIG. 2, labeled prior art, shows a schematic block diagram of a transconductor.

Referring to FIG. 3, a schematic block diagram of current mirror 60 is shown. Current mirror 60 includes operational amplifier 62, as well as output current sensing transistor 64, input resistor (R1) 66 and output resistor (R2) 68. The gate of transistor 64 is coupled to the output of operational amplifier 62, the drain of transistor 64 is coupled to the output current source of current mirror 60, and the source of transistor 64 is coupled to output resistor 68.

In operation of current mirror 60, an input current, $I_{in}$, is provided to input resistor R1 as well as the non-inverting input of operational amplifier 62. The input current passing through input resistor R1 generates a voltage $V_1$ across resistor R1. Because input resistor R1 is coupled between the non-inverting input of operational amplifier 62 and ground, the voltage across resistor R1 ($V_1$) is present at the non-inverting input of operational amplifier 62. By virtue of the feedback path from the top of output resistor R2 to the inverting input of operational amplifier 62, the voltage $V_1$ which is present at the inverting input of operational amplifier 62 is also forced at the inverting input of operational amplifier 62 and thus at the top of output resistor R2 as the voltage $V_2$. I.e., $V_2$ ideally equal to $V_1$. How closely $V_2$ tracks $V_1$ depends upon the open loop gain of amplifier 62. Operational amplifier 62 can be designed such that $V_2$ can be made arbitrarily close of $V_1$. Accordingly, the output current $I_{out}$ of current mirror 60 is a ratio of the resistor sizes R1 and R2.

The input offset created by threshold and other device mismatches in operational amplifier 62 only creates a fixed DC error between $I_{in}$ and $I_{out}$. Threshold mismatches are caused by small random differences in the processing of individual transistors. Accordingly this error does not contribute to the distortion of the current mirror and can be easily trimmed out of the circuit.

The only remaining source of distortion which may be generated by current mirror 60 is due to operational amplifier 62 itself. This distortion is again arbitrarily controlled by the design of the open loop gain of operational amplifier 62. A higher loop gain in a negative feedback configuration reduces distortion.

Figure 4:
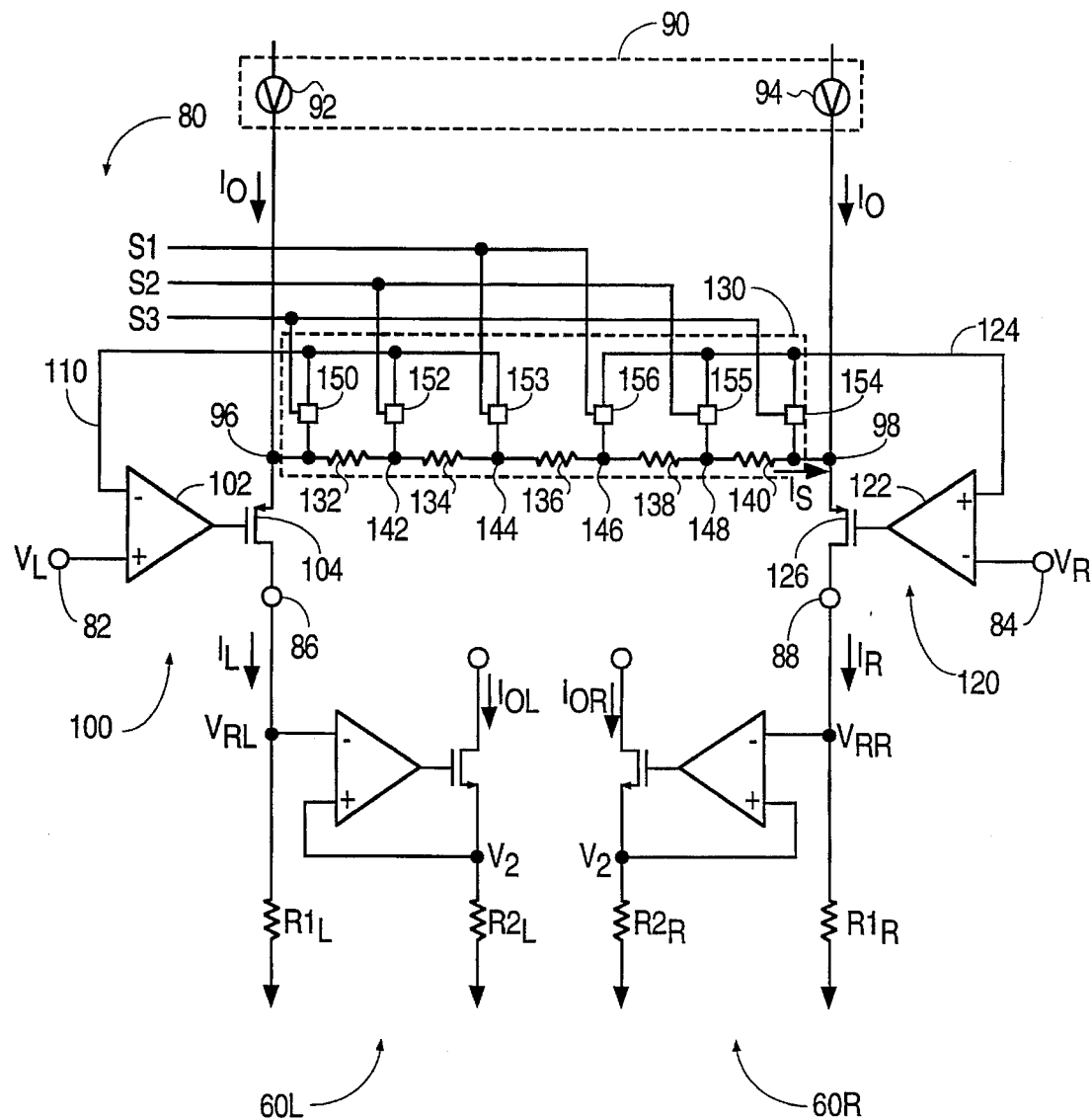
FIG. 4 shows a schematic block diagram of a current mirror of FIG. 3 within a differential transconductor.

Referring to FIG. 4, a schematic block diagram of a differential transconductor 80 having a plurality of current mirrors in accordance with the present invention is shown. More specifically, current mirror 60$_R$ and current mirror 60$_L$ are coupled to the respective output terminals of differential transconductor 80.

The current, $I_L$, which is provided by transconductor 80 is scaled by the ratio $R1_L/R2_L$ and is provided as the output current $I_{OL}$. The current, $I_R$, which is provided by transconductor 80 is scaled by the ratio $R1_R/R2_R$, and is provided as the output current $I_{OR}$.

More specifically, a differential input voltage, $V_L - V_R$, is received between voltage input terminals 82 and 84, and a corresponding differential output current is generated between current output terminals 86 and 68. A current source circuit 90 includes a current source 92 which delivers a current of magnitude $I_O$ into summing node 96 and further includes a current source 94 which delivers a current of magnitude $I_O$ into summing node 98. Input circuit 100 includes an operational amplifier 102 (functioning as a gain block) having a non-inverting input coupled to the voltage input terminal 82 and an inverting input coupled to a first feedback node 110. The output of operational amplifier 102 drives the gate of transistor 104, which in this embodiment is a P channel MOS transistor. Transistor 104 couples summing node 96 to the current output terminal 86. A second input circuit 120 includes an operational amplifier 122 having a non-inverting input coupled to the voltage input terminal 84 and an inverting input coupled to a second feedback node 124. The output of operational amplifier 122 drives the gate of transistor 126, which in this embodiment is also a P channel MOS transistor. Transistor 126 couples summing node 98 to the current output terminal 88.

Circuit 130 includes a selector circuit having an array of switch circuits and includes a resistor circuit having a total resistance of R ohms coupling summing node 96 to summing node 98, and which resistor circuit includes resistors 132, 134, 136, 138, and 140 connected in series and defining a group of intermediate nodes 142, 144, 146, and 148 respectively therebetween. These intermediate nodes, together with summing nodes 96 and 98, form a group of tap nodes of the resistor circuit.

The selector circuit includes an array of switch circuits. Switch circuit 150 couples summing node 96 to feedback node 110 when enabled by logical signal S3. Switch circuit 152 couples intermediate node 142 to feedback node 110 when enabled by logical signal S2, and switch circuit 153 couples intermediate node 144 to feedback node 110 when enabled by logical signal S1. Similarly, switch circuit 154 couples summing node 98 to feedback node 124 when enabled by logical signal S3, switch circuit 155 couples intermediate node 148 to feedback node 124 when enabled by logical signal S2, and switch circuit 156 couples intermediate node 146 to feedback node 124 when enabled by logical signal S1. Logical signals S1, S2, and S3 are preferably digital control signals which select the desired transconductance of the circuit, but may also be a hardwired or some other fixed connection.

The operation of this embodiment can best be understood by first assuming (for example) that logical signal S2 is active, and thus switch circuits 152 and 155 are enabled and remaining switch circuits 150, 153, 156, and 154 are disabled. Since intermediate node 142 is coupled to feedback node 110 which is coupled to the inverting input of operational amplifier 102, input circuit 100 functions to force the voltage of feedback node 110 and intermediate node 142 to follow the voltage, $V_L$, received on voltage input terminal 82. Assuming $V_L$ is greater than $V_R$ and thus $I_s$ is positive, operational amplifier 102 drives the gate of transistor 104 to a suitable voltage such that the voltage of summing node 96 is driven to a voltage higher than $V_L$, so that the voltage of feedback node 110, which is coupled to the inverting input of operational amplifier 102, follows the input voltage $V_L$. Due to the high input impedance of operational amplifier 102, virtually no DC current flows through switch circuit 64 and consequently the voltage of feedback node 110 follows the voltage of intermediate node 142 with negligible voltage drop, noise, or distortion effects.

Similarly, for the right-most portion, input circuit 120 functions to force the voltage of intermediate node 148 to follow the voltage, $V_R$, received on voltage input terminal 84. Thus, with feedback node 110 following input voltage $V_L$ and feedback node 124 following input voltage $V_R$, and since no DC current flows through switch circuits 152 and 155 (due to the high input impedance of operational amplifiers 102 and 122), the differential input voltage $V_L-V_R$ is placed directly across an effective resistance, $R_{eff}$, consisting of resistors 134, 136, and 138 (since for this discussion logical signal S2 is active). This causes a current Is of magnitude $(V_L-V_R)/R_{eff}$ to flow from summing node 96 to summing node 98. If $V_R$ is greater in magnitude than $V_L$ then a negative current $I_s$ flows from summing node 96 to summing node 98 which, of course, is equivalent to a positive current flow from summing node 98 to summing node 96.

Summing node 96 receives a current $I_O$ from current source 92, and sources a current $I_s$ flowing into summing node 98. Thus, the net current which is provided to transistor 104 is $I_O-I_s$, which is then coupled by transistor 104 to the current output terminal 86. Similarly, summing node 98 receives a current $I_O$ from current source 94, and receives a current $I_s$ flowing from summing node 96. Thus, the net current provided to transistor 126 is $I_O+I_s$, which is then coupled by transistor 126 to the current output terminal 88.

Even though the magnitude of the current $I_s$ is set by the input differential voltage $V_L-V_R$ impressed across only the effective resistor, $R_{eff}$, formed by those resistors connected between the selected tap nodes which are coupled to the feedback nodes 110 and 124, the current $I_s$ flows through all the series-connected resistors connected between summing nodes 96 and 98.

Because $I_s=(V_L-V_R)/R_{eff}$, higher conversion gain is accomplished by smaller values of effective resistance. Consequently, for this embodiment the highest conversion gain is achieved by enabling S1, and the lowest conversion gain is achieved by enabling S3.

This programmable topology is achieved by using a string of series-connected resistors, with a group of switch circuits to selectively "tap off" two nodes from the string, and to feedback these nodes to the inverting inputs of the operational amplifiers 102 and 122, respectively. In a preferred embodiment, the selected nodes are symmetrically displaced around resistor 136. By changing the taps, the value of the effective resistor $R_{eff}$ is varied, with a resultant change in the transconductance GM (which varies as $1/R_{eff}$). Individual switch circuits are enabled by digital control signals which are provided based upon information which is stored in internal or external memory.

The lower limit of the dynamic range of the input of transconductor 80 is set by the voltage at the top of resistors $R1_R$ and $R1_L$ of current mirrors $60_R$ and $60_L$, respectively.

The dynamic range of the input of transconductor 80 can be set to maximize the input signal swing as both the maximum input voltage and transconductor resistor, $R_{total}$ are known. More specifically, the system maximizes the input swing of a transconductor based upon a degenerated pair linearized by servo-feedback, i.e., the range of the input voltage $V_L$ Or $V_R$ while the transconductor maintains high linearity, by keeping the voltage at the output terminals as low as possible.

The maximum voltage of $V_{RL}$ is controlled by the values of $R1_L$ and $R_{total}$. More specifically, the voltage of $V_{RL}$ is set forth as $$V_{RL} = R1_L \cdot \left( I_O + \frac{V_{Rmax} - V_{Lmin}}{R_{total}} \right)$$

where $V_{Rmax}$ is the highest desired voltage for $V_R$ and $V_{Lmin}$ is the lowest desired voltage for $V_L$.

To maximize the dynamic range of the input of transconductor 80, the design of transistor 42, i.e., its gate width and gate length, is specified such that the transistor is in its saturated mode of operation when the input voltage $V_L$ is equal to $V_{Lmin}$.

Figure 5:
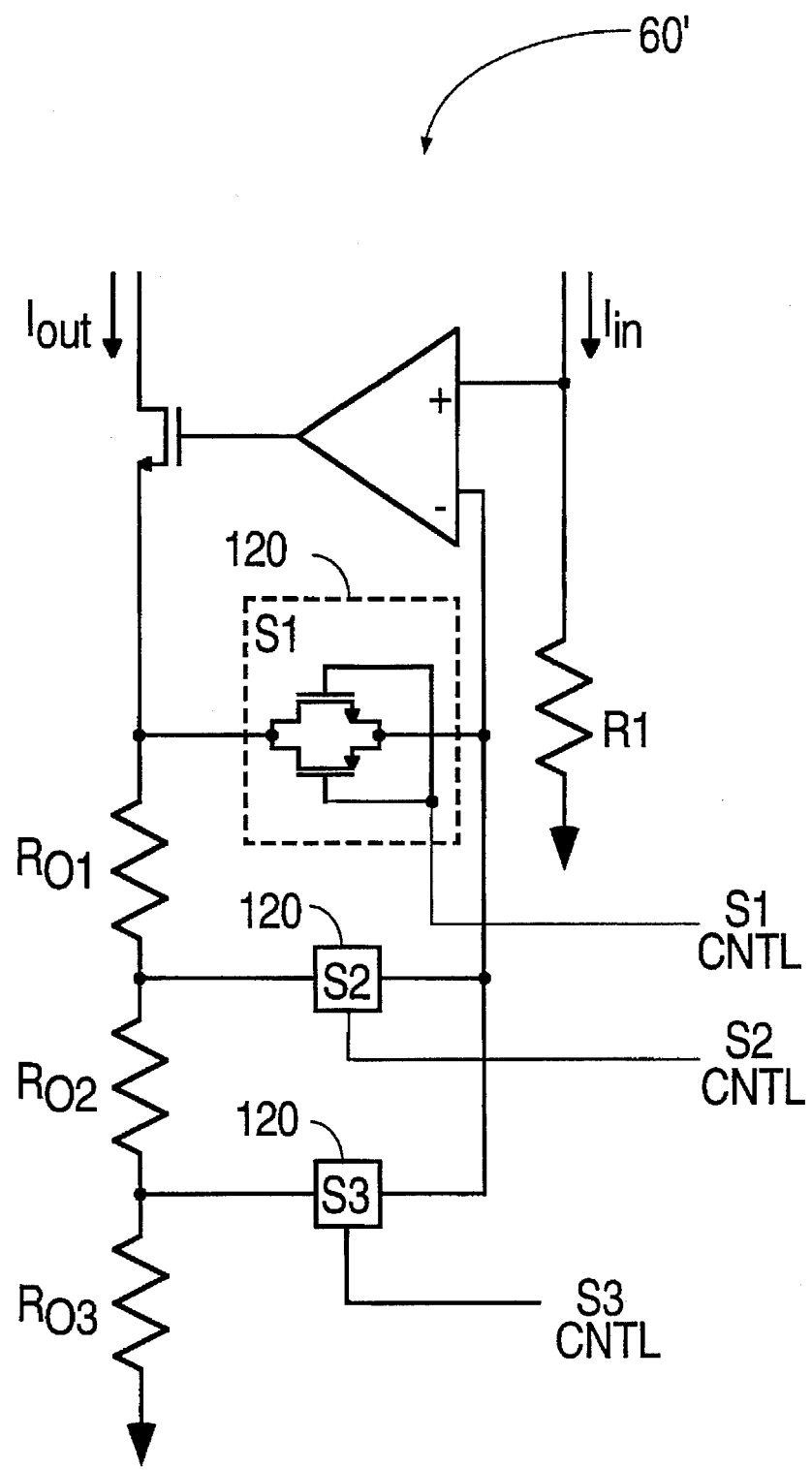
FIG. 5 shows a schematic block diagram of a programmable current mirror in accordance with the present invention.

Referring to FIG. 5, current mirror 60' may be configured as a programmable current mirror by providing a programmable output resistance. The programmable output resistance is provided using a combination of MOS switches and resistors to provide a variable output resistance which is programably set.

The MOS switch which is turned on remains in the feedback loop of operational amplifier 62 but does not contribute to the noise or distortion of the current mirror because no current flows through the switch because of the high input impedance of operational amplifier 62. Each switch 120 (S1, S2, S3) is provided by combining an NMOS device with a PMOS device. Each switch can also be composed of either an NMOS or PMOS device.

In operation, the switch 120 which is actuated controls the gain of the current mirror. More specifically, by controlling current mirror 60' so that switch S1 is 'on', (i.e., the transistors are operating in their linear region so that the switch provides a short) and switches S2 and S3 are 'off' (i.e., the transistors are not conducting so that the switch provides an open circuit), $$I_{OUT} = \frac{R_1 I_\epsilon}{R_{O1} + R_{O2} + R_{O3}}.$$

Alternately, by controlling current mirror 60' so that switch S2 is on and switches S1 and S3 are off, $$I_{OUT} = \frac{R_1 I_\epsilon}{R_{O2} + R_{O3}}.$$

Alternately, by controlling current mirror 60' so that switch S3 is on and switches S1 and S2 are off, $$I_{OUT} = \frac{R_1 I_\epsilon}{R_{O3}}.$$

OTHER EMBODIMENTS

Other embodiments are within the following claims.

For example, while in the preferred embodiment, operational amplifier 62 is implemented with either CMOS folded cascode and two stage amplifiers, these amplifiers may be implemented in any other conventional technology such as MOS, CMOS, BiCMOS or other bipolar technologies.

Additionally, output current sensing transistor 64 may be replaced with a bipolar transistor without affecting the operation of current mirror 60.

Also for example, current mirror 60 may be configured to source current. The preferred embodiment of current mirror 60 sinks current as the resistors are coupled to ground. A complementary configuration connects the resistors to a supply voltage and uses a PMOS transistor or a bipolar PNP transistor to create a current source.

Also for example, while the programmable current mirror shown is FIG. 5 includes three switches and three resistors, it will be appreciated that any number of switches and resistors may be provided and also that different combinations of resistors and switches may also be provided.

In the present invention, a transistor may be conceptualized as having a control terminal which controls the flow of current between a first current handling terminal and a second current handling terminal. An appropriate condition on the control terminal causes a current to flow from/to the first current handling terminal and to/from the second current handling terminal. In a bipolar NPN transistor, the first current handling terminal is the collector, the control terminal is the base, and the second current handling terminal is the emitter. A sufficient current into the base causes a collector-to-emitter current to flow. In a bipolar PNP transistor, the first current handling terminal is the emitter, the control terminal is the base, and the second current handling terminal is the collector. A current exiting the base causes an emitter-to-collector current to flow.

AMOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficient voltage on the gate causes a current to therefore flow from the drain to the source. The gate to source voltage referred to in an N channel MOS device equations merely refers to whichever diffusion (drain or source) has the lower voltage at any given time. For example, the "source" of an N channel device of a bi-directional CMOS transfer gate depends on which side of the transfer gate is at a lower voltage. To reflect the symmetry of most N channel MOS transistors, the control terminal is the gate, the first current handling terminal may be termed the "drain/source", and the second current handling terminal may be termed the "source/drain". Such a description is equally valid for a P channel MOS transistor, since the polarity between drain and source voltages, and the direction of current flow between drain and source, is not implied by such terminology. Alternatively, one current-handling terminal may be arbitrarily deemed the "drain" and the other deemed the "source", with an implicit understanding that the two are not distinct, but interchangeable.

What is claimed is:

1. A current mirror for use at an output of a transconductor, the current mirror receiving an input current and providing an output current at an output current source, the current mirror comprising:

an operational amplifier having inverting and non-inverting input terminals and an output terminal;

an input resistor having first and second input resistor terminals and a first resistance value, the first input resistor terminal being coupled to the non-inverting input terminal of the operational amplifier, the second resistor terminal being coupled to a voltage;

an output resistor having first and second output resistor terminals and a second resistance value, the first output resistor terminal being coupled to the inverting input terminal of the operational amplifier via a feedback path, the second output resistor terminal being coupled to a voltage; and an output transistor having first and second current handling terminals and a control terminal, the control terminal being coupled to the output terminal of the operational amplifier, the first current handling terminal being coupled to the first output resistor terminal, and the second current handling terminal being coupled to the output current source;

wherein the ratio of the input current to the output current is a ratio of the first and second resistance values.

2. The current mirror of claim 1 wherein the transistor comprises a transistor chosen from the group consisting of P channel MOS transistors, N channel MOS transistors, PNP bipolar transistors and NPN bipolar transistors.

3. The current mirror of claim 1 wherein the voltage is ground.

4. The current mirror of claim 1 wherein the voltage is a supply voltage.

5. A current mirror for use at an output of a transconductor, the current mirror receiving an input current and providing an output current at an output current source, the current mirror comprising:

a gain circuit having first and second input terminals and an output terminal;

an input resistor having first and second input resistor terminals and a first resistance value, the first input resistor terminal being coupled to the first input terminal of the gain circuit, the second resistor terminal being coupled to a voltage;

an output resistor having first and second output resistor terminals and a second resistance value, the first output resistor terminal being coupled to the second input terminal of the gain circuit via a feedback path, the second output resistor terminal being coupled to a voltage; and an output transistor having first and second current handling terminals and a control terminal, the control terminal being coupled to the output terminal of the gain circuit, the first current handling terminal being coupled to the first output resistor terminal, and the second current handling terminal being coupled to the output current source;

wherein the ratio of the input current to the output current is a ratio of the first and second resistance values.

6. The current mirror of claim 5 wherein the transistor comprises a transistor chosen from the group consisting of P channel MOS transistors, N channel MOS transistors, PNP bipolar transistors and NPN bipolar transistors.

7. The current mirror of claim 5 wherein the first input terminal of the gain circuit is a non-inverting input terminal, and the second input terminal of the gain circuit is an inverting input terminal.

8. The current mirror of claim 5 wherein the voltage is ground.

9. The current mirror of claim 5 wherein the voltage is a supply voltage.

10. A programmable current mirror, the current mirror receiving an input current and providing an output current at an output current source, the programmable current mirror comprising:

an operational amplifier having inverting and non-inverting input terminals and an output terminal;

an input resistor having first and second input resistor terminals and a first resistance value, the first input resistor terminal being coupled to the non-inverting input terminal of the operational amplifier, the second resistor terminal being coupled to a voltage, the input resistor having an input resistance value;

a programmable output resistor having first and second output resistor terminals and a programmable second resistance value, the first output resistor terminal being coupled to the inverting input terminal of the operational amplifier via a feedback path, the second output resistor terminal being coupled to a voltage; and an output transistor having first and second current handling terminals and a control terminal, the control terminal being coupled to the output terminal of the operational amplifier, the first current handling terminal being coupled to the first output resistor terminal, and the second current handling terminal being coupled to the output current source;

wherein the ratio of the input current to the output current is a ratio of the first resistance value to the programmable second resistance value.

11. The programmable current mirror of claim 10 wherein the programmable output resistor includes a first output resistor having first and second first output resistor terminals, the first output resistor terminals being coupled to the second current handling terminal of the transistor;

a second output resistor having first and second second output resistor terminals, the first second output resistor terminal being coupled to the second first output resistor terminal, the second second output resistor terminal being coupled to the voltage; and a first switch having first and second switch terminals, the first switch terminal being coupled to the first second output resistor terminal and the second first output resistor terminal, the second switch terminal being coupled to the inverting operational amplifier input terminal; and a second switch having first and second second switch terminals, the first second switch terminal being coupled to the first first resistor terminal and the second second switch terminal being coupled to the inverting input terminal of the operational amplifier.

12. The programmable current mirror of claim 10 wherein the programmable output resistor further includes a third output resistor having first and second third output resistor terminals, the first third output resistor terminal being coupled to the second second output resistor terminal, the second third output resistor terminal being coupled to the voltage; and a third switch having first and second third switch terminals, the first third switch terminal being coupled to the second second output resistor terminal and the first third first output resistor terminal, the second third switch terminal being coupled to the inverting operational amplifier input terminal.

13. The programmable current mirror of claim 10 wherein the programmable output resistor is controlled by a control signal.

14. A transconductor for generating a differential current between first and second current mirror output terminals responsive to a differential voltage operably impressed between first and second voltage input terminals, comprising:

a current source circuit configured to deliver a predetermined amount of current into each of a first summing node and a second summing node;

a resistor coupled between the first and second summing nodes;

a first gain block having a first input coupled to the first voltage input terminal, a second input coupled to a first feedback node, and an output;

a first transistor having a first current-handling terminal coupled to the first summing node, having a second current-handling terminal coupled to a first current output terminal, and having a control terminal coupled to the output of the first gain block;

a second gain block having a first input coupled to the second voltage input terminal, a second input coupled to a second feedback node, and an output;

a second transistor, having a first current-handling terminal coupled to the second summing node, having a second current-handling terminal coupled to a second current output terminal, and having a control terminal coupled to the output of the second gain block;

a first current mirror, the first current mirror coupled to the first current output terminal and providing an output current to the first current mirror output terminal; and a second current mirror, the second current mirror coupled to the second current output terminal and providing an output current to the second current mirror output terminal;

each of the first and second current mirrors including a current gain circuit having first and second input terminals and an output terminal;

a current mirror input resistor having first and second input resistor terminals and a first resistance, the first input resistor terminal being coupled to the first input terminal of the gain circuit, the second resistor terminal being coupled to a voltage;

a current mirror output resistor having first and second output resistor terminals and a second resistance, the first output resistor terminal being coupled to the second input terminal of the gain circuit via a feedback path, the second output resistor terminal being coupled to a voltage; and a current mirror output transistor having first and second current handling terminals and a control terminal, the control terminal being coupled to the output terminal of the gain circuit, the first current handling terminal being coupled to the respective current mirror output terminal, and the second current handling terminal being coupled to the first output resistor terminal;

wherein the ratio of the input current provided to the current mirror to the output current provided by the current mirror is a ratio of the first resistance to the second resistance.

* * * * *